United States Patent [19]
Furutani et al.

[11] Patent Number: 5,128,636
[45] Date of Patent: Jul. 7, 1992

[54] DIODE LIMITER

[75] Inventors: Nagahisa Furutani, Kawasaki; Hiroshi Mugiya, Tama, both of Japan

[73] Assignee: Fujitsu Limited, Kawasaki, Japan

[21] Appl. No.: 622,199

[22] Filed: Dec. 5, 1990

Related U.S. Application Data

[63] Continuation of Ser. No. 400,394, Aug. 30, 1989, abandoned.

Foreign Application Priority Data

Aug. 30, 1988 [JP] Japan ............... 63-216734

[51] Int. Cl.⁵ ............................... H01P 5/04
[52] U.S. Cl. ...................... 333/17.2; 455/217
[58] Field of Search .............. 333/17.2; 455/217; 328/8; 307/565

[56] References Cited
U.S. PATENT DOCUMENTS
4,635,297 1/1987 Polischuk .............. 333/17.2 X

*Primary Examiner*—Paul Gensler
*Attorney, Agent, or Firm*—Staas & Halsey

[57] ABSTRACT

A diode limiter including a signal line connects an input terminal to which a high power electric pulse signal is applied and an output terminal connected to a receiver. A PIN diode conducts when the high power electric pulse signal is applied thereto and provides a low impedance connection of the signal line to ground. A directional coupler extracts a part of the high power electric pulse signal out of the signal line. A detector diode is inserted in the return direct current path of the PIN diode, a resistor is inserted into the path including the directional coupler, and a means is provided for applying the voltage generated in the resistor to the PIN diode.

9 Claims, 6 Drawing Sheets

DIODE LIMITER

This application is a continuation of application Ser. No. 07/400,394, filed Aug. 30, 1989, now abandoned.

BACKGROUND OF THE INVENTION

1. Field of the Invention

This invention relates to a diode limiter, especially, to a diode limiter used for a pulse radar apparatus or the like.

2. Description of the Related Art

In a pulse radar apparatus, high power transmission pulses generated in a transmitter are emitted from an antenna. Echoes reflected from an object are received by the same antenna and led to a receiver. These transmitting and receiving operations are continuously repeated.

Therefore, in the transmitting operation, the antenna should be connected to the transmitter, while, in the receiving operation (i.e., in the time interval other than for the transmitting operation), it should be connected to the receiver. Thus, a switching means is required in the pulse radar apparatus for switching the connection of the antenna from the transmitter to the receiver and vice versa.

The transmission-receiving switching means as mentioned above functions to switch the connection of the antenna from the transmitter to the receiver and vice versa and further functions to protect the head of the receiver from high power pulse signals such as the transmitting pulse signals emitted from the same station, excessively powerful echoes reflected from an object located nearby, or a transmitting pulse emitted from another adjacent radar station.

Recently, reliable protection has been required especially for a pulse radar apparatus having a high performance receiver head.

In the prior art, to obtain such a switching function and a protecting function in the pulse radar apparatus, a discharge tube such as a TR tube (transmit-receive tube) and an ATR tube (anti-TR tube) were used.

However, these kinds of discharge tubes had the disadvantage that there was usually a certain time lag between when the tube was turned ON and when the discharge operation thereof was started, whereby a part of the rising portion of the transmission pulse was leaked to the receiver, causing insufficient protection.

Further, these kinds of discharge tubes have another disadvantage in that the short range detection distance is considerably increased, since there is necessarily recovery time when the discharge operation is stopped.

Therefore, a diode limiter which can operate at rather higher speed has recently been used instead of a discharge tube.

Conventional diode limiters as mentioned above are shown in FIGS. 5(a) to (b), for example.

Figure 5A:
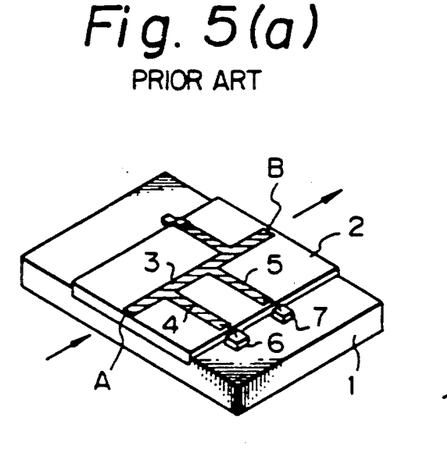
FIG. 5(a) is a schematic perspective view of a first conventional diode limiter.

In FIG. 5(a), a carrier 1 and an MIC (microwave integrated circuit) substrate 2 are provided. A line 3 having a characteristic impedance of 50 Ω is formed on a surface of the MIC substrate 2.

One end thereof, i.e., an input terminal A, is connected to an antenna and a transmitter, while the other end thereof, i.e., an output terminal B, is connected to a receiver.

On the MIC substrate 2, matching circuits 4 and 5 are provided with the 50 Ω line 3. First ends of the circuits 4 and 5 are connected to the line 3. PIN diodes 6 and 7 are connected to the second opposite ends of the matching circuits 4 and 5.

Figure 5B:
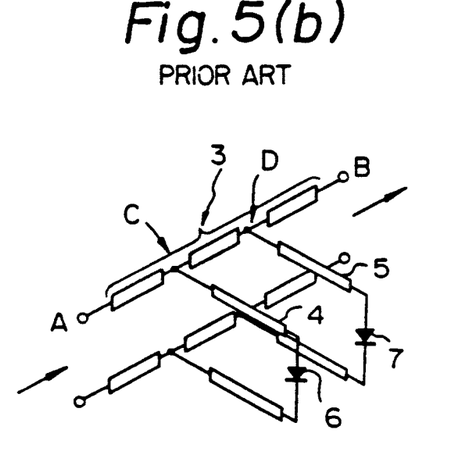
FIG. 5(b) is a schematic view of an equivalent circuit of the first conventional diode limiter.

FIG. 5(b) shows an equivalent circuit corresponding to the diode limiter shown in FIG. 5(a).

In the construction as shown in FIGS. 5(a) and 5(b), when a high power electric pulse signal is applied to the input terminal A, the PIN diode 6, connected through the matching circuit 4 to the input terminal A, is made conductive and becomes a low impedance. Therefore, the matching line 4 is short-circuited at the second end thereof.

In this situation, when the length of the matching line 4 defined from the connecting point (C), between the matching circuit 4 and the 50 Ω line 3, to the point which is short circuited on the end of the line, is set to $\lambda/2$ or a length corresponding to a whole multiple of $\lambda/2$, the connecting point (C) is short-circuited by the impedance of the PIN diode 6, whereby passage of the high power electric pulse signal to the output B is prevented.

However, since the impedance of the PIN diode never becomes zero, a small amount of power leaks therethrough and is actually transmitted through the point (c) to the output terminal B.

But this leaked power can be prevented from being transmitted to the output B by a low impedance condition of the connecting point (D), formed between the matching circuit 5 and the 50 Ω line 3, which is the next stage of the contacting point (C). Therefore, the level of the power at the output terminal B is restricted to a level which is sufficient for the receiver to be protected.

Conversely, when a weak receiving signal is applied to the input terminal A, the PIN diodes 6 and 7 are not made conductive and the matching lines 4 and 5 are open at their ends. As a result, the matching circuits 4 and 5 and the PIN diodes 6 and 7 appears as high impedance with respect to the 50 Ω line 3.

Accordingly, the receiving signal can be transmitted to the output terminal B with low loss.

That is, when protecting the receiver from a high power transmitted pulse, signal, the input terminal A and the output terminal B of the 50 Ω line 3 are isolated from each other by the conduction of the PIN diodes 6 and 7, while when a receiving operation is carried out, the input terminal A and the output terminal B of the 50 Ω line 3 are connected to each other with low loss without the PIN diode being made conductive.

Figure 6A:
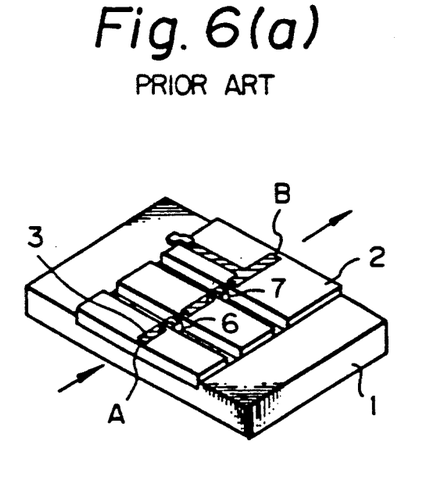
FIG. 6(a) is a schematic perspective view of a second conventional diode limiter.
Figure 6B:
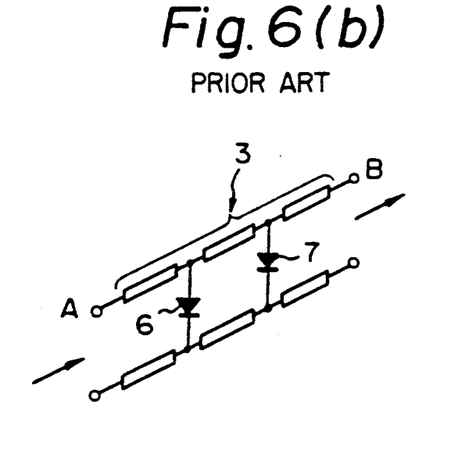
FIG. 6(b) is a schematic view of an equivalent circuit of the second conventional diode limiter.

FIGS. 6(a) and (b) show another conventional diode limiter embodiment wherein the PIN diodes 6 and 7 are directly connected to the 50 Ω line 3.

The main object of such a diode limiter is to reduce the expected maximum power applied to the input terminal A to a level sufficient to protect the receiver head. Usually, the transmitting power emitted from the same station is given as the expected maximum power.

On the other hand, the withstand power of the receiver head is different depending on the radar system to which the receiver head belongs.

Accordingly, the diode limiter is required to have an isolation characteristics tailored to individual system specifications.

In the conventional limiter shown in FIGS. 5(a) to (b), it is required to adjust the characteristics of the PIN diodes 6 and 7 in accordance with the system used to satisfy the required isolation characteristic in the system, but a cost problem arises.

Figure 7:
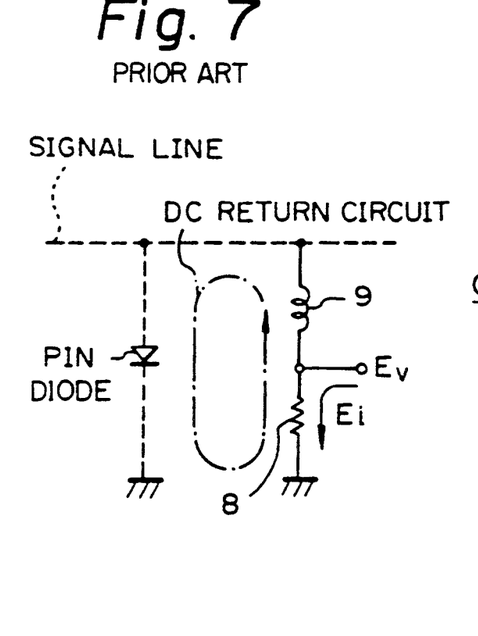
FIG. 7 is a schematic view of a prior art direct current return circuit used in the conventional diode limiters shown in FIGS. 5(a) and (b)

To overcome this problem, a separate method has been used in which the circuit as shown in FIG. 7 is added to the circuit shown in FIGS. 5 and 6.

In FIG. 7, a resistor 8 and an RF (radio frequency) coil 9 affording a direct current (DC) return circuit for the 50 Ω (signal) line 3 are provided. A bias voltage $E_v$ is applied across the resistor 8.

In this construction, a forward voltage of $E_v$ is always applied to the 50 Ω signal line 3, therefore the ON-OFF characteristics of the PIN diode connected to the 50 Ω signal line 3 can be controlled by adjusting the value of the forward voltage $E_v$.

Accordingly, an isolation characteristic suitable for individual system specifications can be obtained.

However, in the embodiment shown in FIG. 7, since a resistor 8 is provided in the direct current (DC) return circuit for the 50 Ω signal line 3, the resistance value of the resistor 8 must be set at an extremely low value such as 3 Ω to pass the DC current smoothly in the return circuit. Therefore, another problem arises in that a bias current $E_i$ passing through the resistor 8, when the power source is $E_v$, becomes large, for example, about 150 mA, which is disadvantageous in terms of the power consumption.

Figure 8:
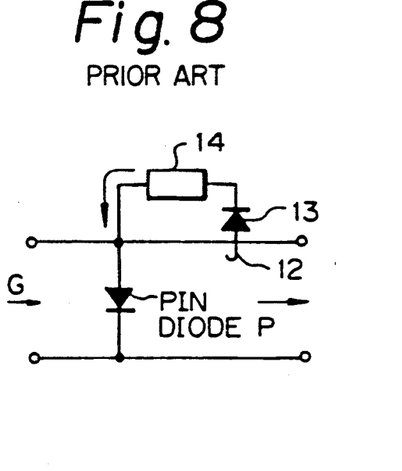
FIG. 8 is a schematic view showing a prior art circuit used in a third conventional diode limiter.

To overcome this problem, the following countermeasures are provided:

(1) As shown in FIG. 8, a pickup probe 12 and a PIN diode P are provided inside a waveguide G. The ON-OFF characteristic of the PIN diode P is controlled by a compulsory bias voltage generated by a DC amplifier 14 in accordance with an output of the pickup probe 12, input through a detector diode 13 to the amplifier 14.

Figure 9:
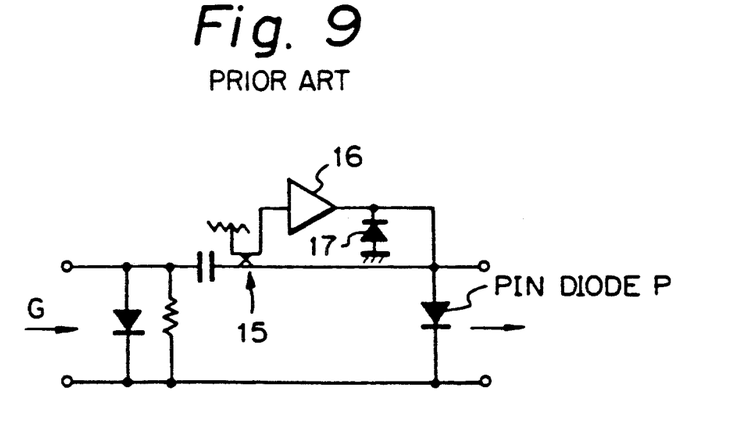
FIG. 9 is a schematic view showing a prior art circuit used in a fourth conventional diode limiter.

(2) As shown in FIG. 9, a PIN diode P is provided in the waveguide G. A directional coupler 15, a RF amplifier 16, and a detector diode 17 are provided in the vicinity of the waveguide G. The ON-OFF characteristic of the PIN diode P is controlled so that the power taken out by the directional coupler 15 is amplified by the RF amplifier 16 and the output of the amplifier 16 is applied to the PIN diode P under the control of the detector diode 17.

However, those countermeasures require a DC amplifier, and a RF amplifier respectively; thus, the problem arises that the construction of each diode limiter becomes complicated.

SUMMARY OF THE INVENTION

The object this invention is to provide a diode limiter which can adjust the level of suppression power transmitted in a system without making the construction complicated.

To attain the object of this invention, there is provided a diode limiter which includes:

a signal line connecting an input terminal to which a high power electric pulse signal is applied and an output terminal connected to a receiver, a PIN diode which becomes conductive when the high power electric pulse signal is applied thereto, so as to connect the signal line to a ground line through a low impedance, a directional coupler for taking a part of the high power electric pulse signal out of the signal line, a detector diode inserted into a direct current return path of the PIN diode, a resistor inserted into an electrical path including the directional coupler, and a means for applying an electrical voltage generated in the resistor to the PIN diode.

In this invention, part of the power of the transmitting pulse signal is taken out by the directional coupler, and a voltage corresponding to the power taken by the directional coupler is generated by the resistor. This voltage is applied to the PIN diode as a compulsory bias voltage to adjust the operating point of the PIN diode.

When the ON-OFF characteristic of the PIN diode P should be adjusted, the value of the resistor may be suitably changed so as to change the magnitude of the compulsory bias voltage and obtain the necessary isolation characteristic.

DESCRIPTION OF THE PREFERRED EMBODIMENTS

The preferred embodiments of this invention will be described with reference to the attached drawings hereunder.

Figure 1A:
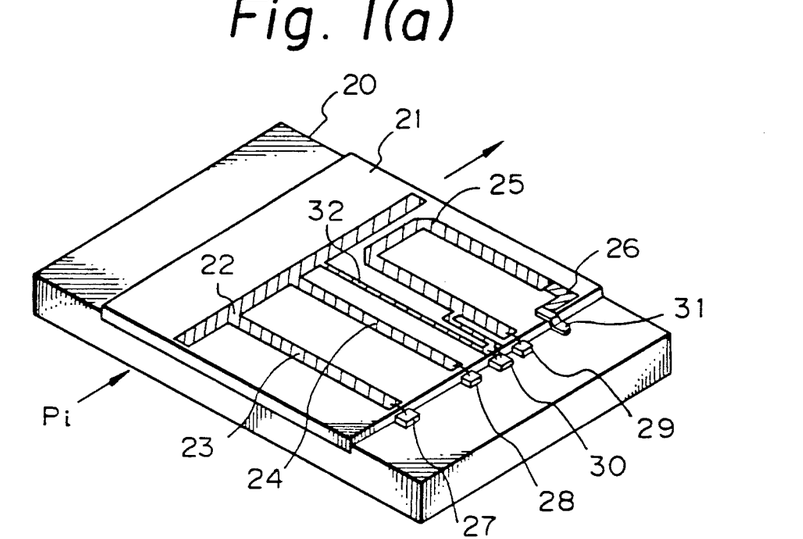
FIG. 1(a) is a schematic perspective view of a first embodiment of the present invention.
Figure 1B:
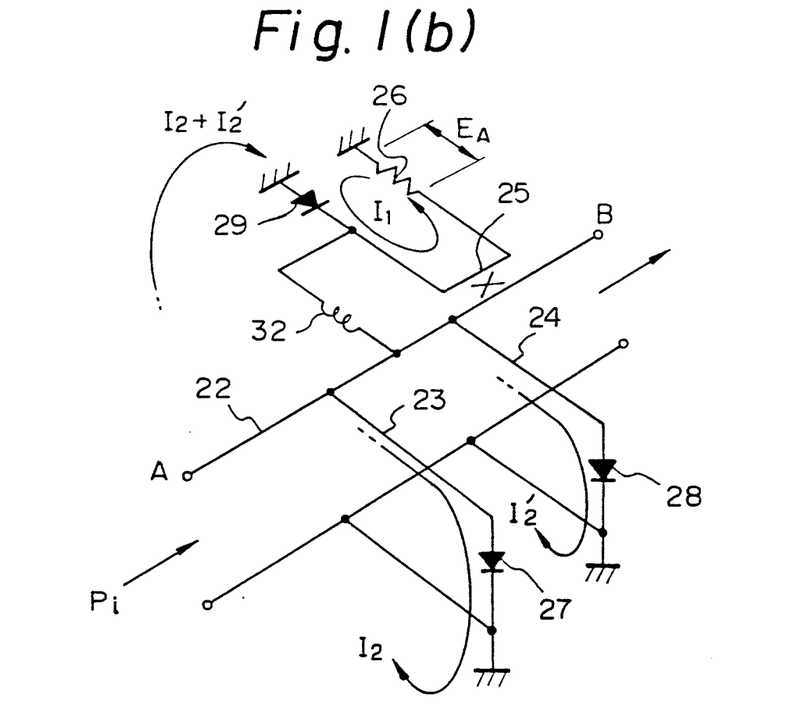
FIG. 1(b) is a schematic view of an equivalent circuit of the first embodiment of the present invention.

FIGS. 1(a) and (b) show a first embodiment of a diode limiter of this invention.

In FIG. 1(a), a carrier or supporting member 20, an MIC substrate 21, a signal line 22 having a characteristic impedance of 50 Ω for example, matching circuits 23 and 24, a directional coupler 25 having a configuration of a strip line, a resistor 26, PIN diodes 27 and 28, a detector diode 29, a bypass capacitor 30, a ground connecting component 31, and an RF (radio frequency) coil 32 (used as an applying means) are provided.

FIG. 1(b) shows an equivalent circuit of the diode limiter shown in FIG. 1(a). In FIG. 1(b), elements, the same as in FIG. 1(a), carry the same reference numerals.

The signal line 22 formed on the MIC substrate 21 connects the input terminal A to which the high power pulse signal is applied and the output terminal B connected to a receiver. The PIN diodes 27 and 28 become conductive when the high power pulse signal is applied thereto. The signal line 22, which is located away from the PIN diodes 27 and 28 at a distance of λ/2 or a whole multiple of λ/2, is connected to a ground line through the matching circuits 23,24 and the ON state PIN diodes 27, 28 which present a low impedance.

The directional coupler 25 functions to take out a part of the high power pulse signal from the signal line 22 and constitutes a current passage $I_1$ with the resistor 26 and the detector diode 29.

The detector diode 29 provided in the current passage $I_1$, also constitutes a part of the DC return current passage $I_2$ and $I_2$, of the PIN diodes 27 and 28, respectively.

The RF coil 32 serves as a means for applying the voltage $E_4$ generated by the current passage $I_1$ to the PIN diodes 27 and 28. The voltage $E_4$ is the product of the current flowing in the electrical current passage $I_1$ and the resistance of the resistor 26.

In this construction, consider the transient time of the rise of the high power pulse signal $P_i$ applied to the input terminal A of the signal line 22. A part of the high power pulse signal $P_i$ as so applied, is taken out by the directional coupler 25. Therefore, the current flows in the current passage $I_1$, and the voltage $E_4$ is generated in the resistor 26.

On the other hand, the volta $E_4$ is supplied to the PIN diodes 27 and 28 through the RF coil 32 as a compulsory bias voltage.

That is, the level of the voltage $E_4$ becomes large as the level of the high power pulse signal $P_i$ increases. Therefore, the level of the compulsory bias voltage is also increased to allow the conduction of the PIN diodes 27 and 28. More particularly, when the level of the high power pulse signal $P_i$ exceeds a predetermined level, the PIN diode 27 is made conductive initially and thereafter the PIN diode 28 is made conductive.

Thus, the signal line 22, which is separated from the PIN diodes 27 and 28 by a distance of λ/2 or a whole multiple of λ/2 (wherein λ denotes the wavelength of a carrier wave frequency of the high power pulse signal $P_i$), is connected to the PIN diodes 27 and 28 when the matching circuits 23 and 24 are at a low impedance. Therefore, the high power pulse signal $P_i$ is reflected back in the direction of the input terminal A, to interrupt the transmittance of the high power pulse signal $P_i$ from the input terminal A to the output terminal B, causing the line 22 to be isolated.

In this situation, when the compulsory bias voltage is increased, the conduction rate of the PIN diodes 27 and 28 s also increased, while when the compulsory bias voltage is decreased, the conduction rate of the PIN diodes 27 and 28 is decreased.

For example, when the conduction rate is decreased, the PIN diodes 27 and 28 are not made conductive until the level of the high power pulse signal $P_i$ is increased up to a certain level. Therefore, the level of the power output from the output terminal B is relatively large. In some cases, the receiver may be damaged by the same.

Accordingly, it is necessary for the level of the compulsory bias voltage to be tailored to the isolation characteristic required. In this embodiment, this can be done merely by changing the value of the resistor 26.

Namely, if the value of the resistor 26 is changed to a higher rating, the voltage $E_4$ is increased, in turn increasing the compulsory bias voltage. Therefore, the conduction rate of the PIN diodes 27 and 28 is increased and thus the level of the leakage power (transmitted power) from the output terminal B is suppressed.

In this embodiment, therefore, the necessary isolation characteristic can be obtained merely by suitably adjusting the value of the resistor 26 to comply with the system requirement.

Further, in this embodiment, the construction of the diode limiter is not complicated because a DC amplifier or the like is not used.

Moreover, since the resistor is provided at a position away from the DC return passages $I_2$, $I_2$' of the PIN diodes 27 and 28, when the value of the resistor 26 is set, the DC return current need not be considered. Therefore, the value can be set at any desired level.

Figure 2A:
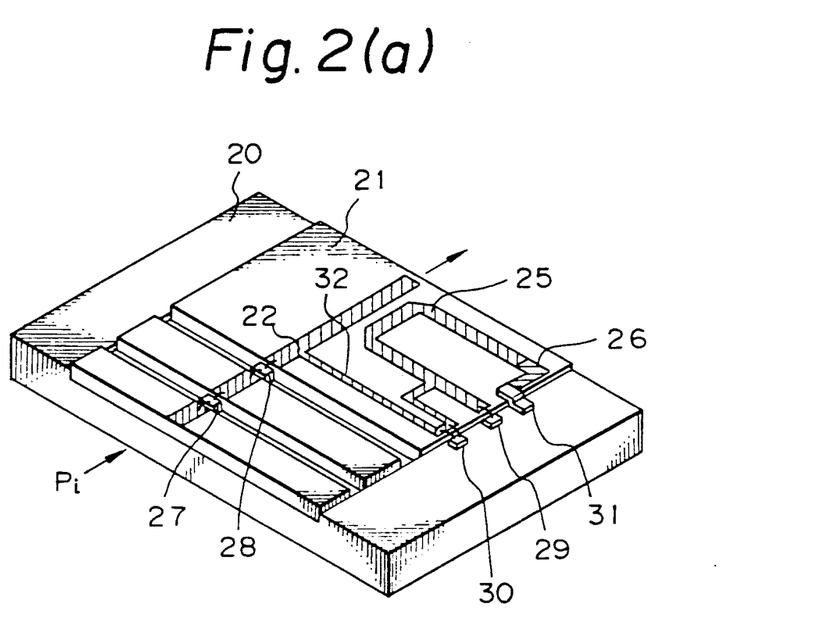
FIG. 2(a) is a schematic perspective view of a second embodiment of the present invention.
Figure 2B:
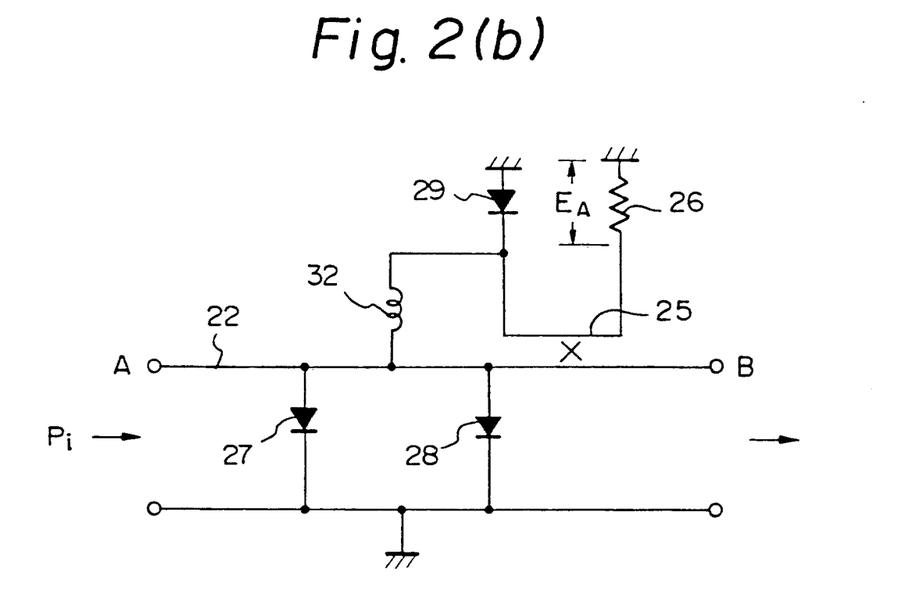
FIG. 2(b) is a schematic view of an equivalent circuit of the second embodiment of the present invention.

FIGS. 2(a) and 2(b) show a second embodiment of this invention. Elements the same as those of FIG. 1 carry the same reference numerals.

In this embodiment, the PIN diodes 27 and 28 are directly connected to the signal line 22, as in the FIGS. 1(a) and (b) embodiment. A part of the high power pulse signal $P_i$ is taken out by the directional coupler 25 and thereby the voltage $E_4$ is generated in the resistor 26. The voltage $E_4$ is supplied to the PIN diodes 27 and 28. Accordingly, the same operation and effect as in the first embodiment can be obtained.

FIGS. (a) and (b) show a third embodiment of this invention. Elements the same as those of FIG. 1 carry the same reference numerals.

Figure 3A:
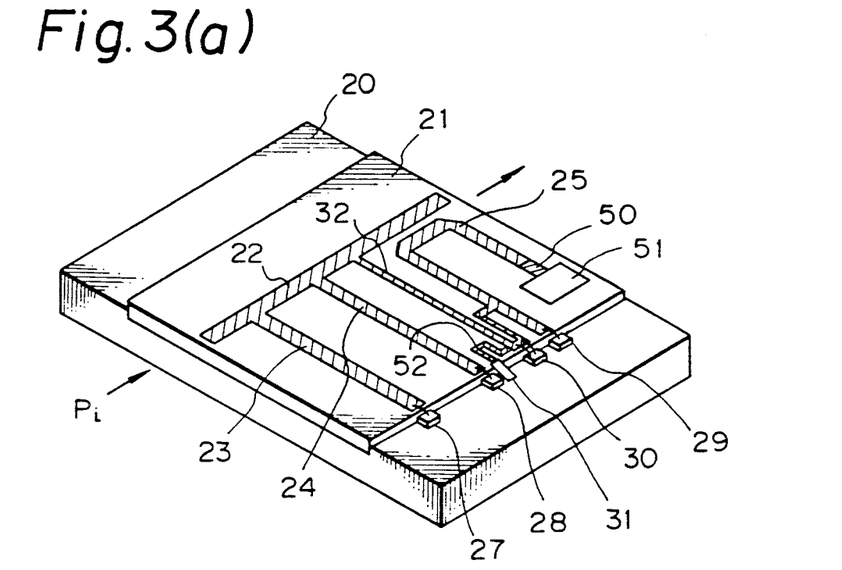
FIG. 3(a) is a schematic perspective view of a third embodiment of the present invention.
Figure 3B:
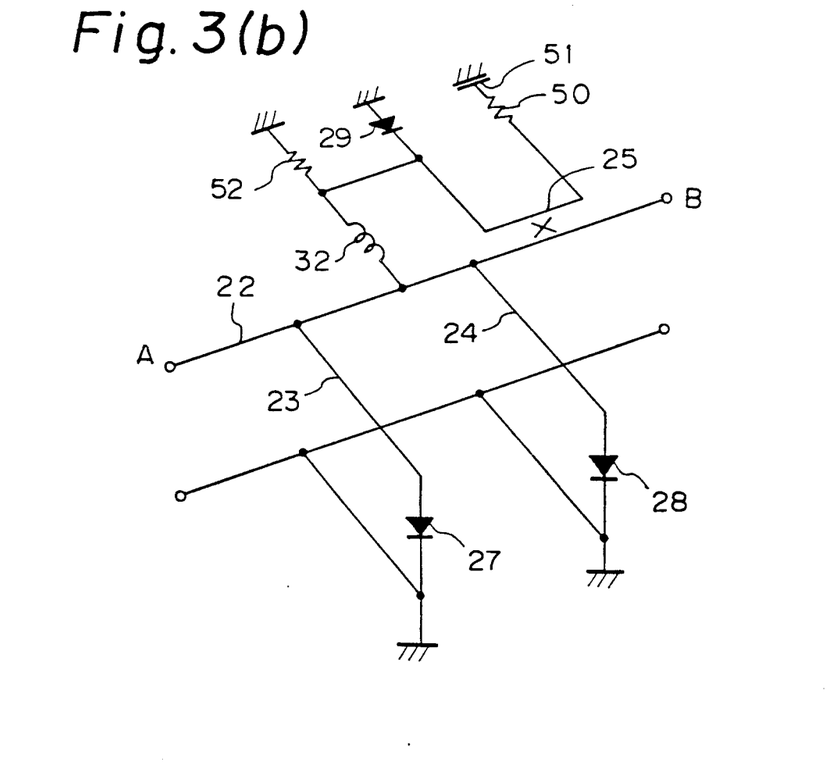
FIG. 3(b) is a schematic view of an equivalent circuit of the third embodiment of the present invention.

In this embodiment, the load resistor 50 of the directional coupler 25 is connected through the strip line 51 to the RF earth (or ground) so that only an alternating current can be transmitted therethrough. In addition, a resistor 52 is separately provided as a load resistor of the detector diode 29.

In this embodiment, the isolation characteristic can be changed by varying the value of the resistance of the resistor 52 and thereby in turn changing the level of the compulsory bias voltage applied to the PIN diodes 27 and 28. Accordingly, the same operation and effect as in the first embodiment can be obtained.

Figure 4:
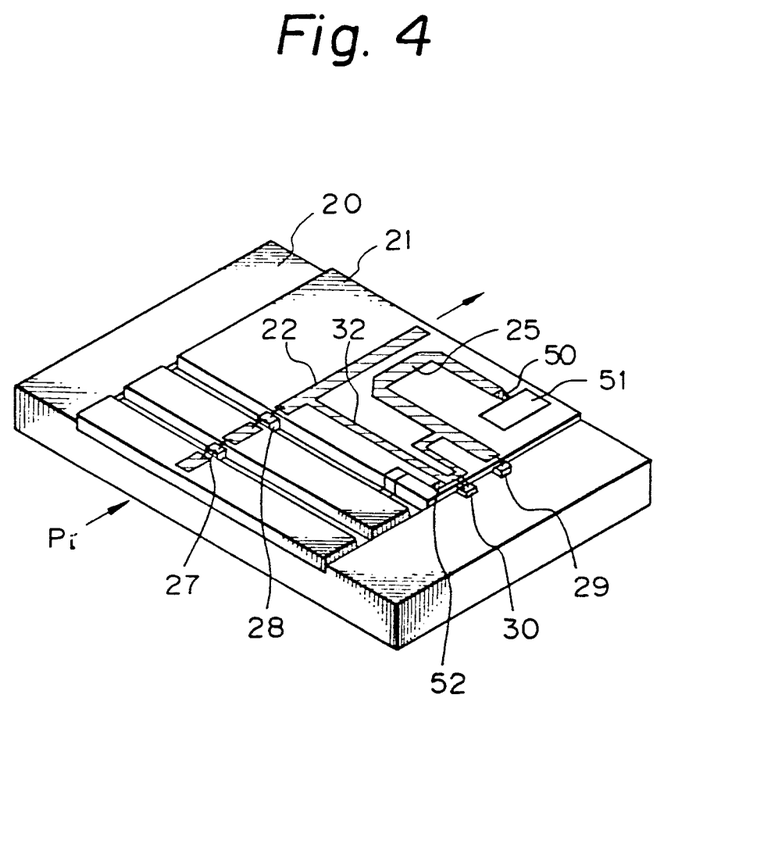
FIG. 4 is a schematic perspective view of a fourth embodiment of the present invention.

FIG. 4 shows a fourth embodiment of this invention. As shown, the PIN diodes 27 and 28 are directly connected to the signal line 22. The rest of the components are the same as in the third embodiment.

As explained above, in these embodiments, a voltage corresponding to the level of the voltage $P_i$, partly taken out from the signal line 22 by the directional coupler 25, is generated at the resistor 26 (or resistor 52). This voltage is applied to the PIN diodes 27 and 28 as a compulsory bias.

Thus, the ON-OFF characteristic of the PIN diodes 27 and 28 can be controlled by varying the value of the resistor 26 (or resistor 52). Further, the level of the transmitted power from the output terminal B of the signal line 22 can be set at the required system level.

According to this invention, the level of suppression cf the transmitted power can be effectively controlled without making the construction of the diode limiter complicated.

We claim:

1. A diode limiter circuit having an input terminal, to which high power electrical pulse signals are applied, and an output terminal adapted for connection to a receiver, comprising:
   a signal line connecting the input terminal to the output terminal;
   a ground line;
   a PIN diode connected between the signal line and the ground line and, when selectively turned on and rendered conductive, defining a direct current return path and providing a low impedance connection of the signal line to the ground line;

a detector diode inserted in the direct current return path of said PIN diode;

a directional coupler which is coupled to said signal line at a position between the connection of the PIN diode thereto and said output terminal, said directional coupler having first and second ends and forming a series circuit with said detector diode and a resistor, and extracting a part of each high power electrical pulse signal applied to said signal line from said signal line and supplying said extracted part to said series circuit, said extracted and coupled part of said high power electrical pulse signal generating a voltage across said series circuit; and means for supplying said voltage generated across said series circuit to said PIN diode for selectively turning on said PIN diode to thereby render same conductive at a predetermined value of said voltage generated across said series circuit.

2. A diode limiter as recited in claim 1, wherein said supplying means comprises an RF coil.

3. A diode limiter as recited in claim 2, wherein said RF coil has first and second terminals and is connected at said first terminal thereof to said series circuit at a point between said detector diode and said directional coupler, and is connected at said second terminal thereof to said signal line.

4. A diode limiter as recited in claim 1, wherein said resistor has a selectively variable resistance value, thereby for selectively varying the value of the voltage generated across said series circuit by said extracted part of the high power electrical pulse signal and correspondingly the turn-on of said PIN diode, relative to a given level of said high power electrical pulse signal applied to the diode limiter circuit.

5. A diode limiter circuit having an input terminal, to which high power electrical pulse signals are applied, and an output terminal adapted for connection to a receiver, comprising:

a signal line connecting the input terminal to the output terminal;

a ground line;

a matching line having first and second ends, the first end being connected to said signal line;

a PIN diode connected between the second end of said matching line and said ground line and, when selectively turned on and rendered conductive, defining a direct current return path and providing a low impedance connection of the signal line to the ground line;

a detector diode inserted in the direct current return path of said PIN diode;

a directional coupler which is coupled to said signal line at a position between the connection of the PIN diode thereto and said output terminal, said directional coupler having first and second ends and forming a series circuit with said detector diode and a resistor, and extracting a part of each high power electrical pulse signal applied to said signal line from said signal line and supplying said extracted part to said series circuit, said extracted and coupled part of said high power electrical pulse signal generating a voltage across said series circuit; and means for supplying said voltage generated across said series circuit to said PIN diode for selectively turning on said PIN diode to thereby render same conductive at a predetermined value of said voltage generated across said series circuit.

6. A diode limiter as recited in claim 5, wherein said supplying means comprises an RF coil.

7. A diode limiter as recited in claim 6, wherein the RF coil has first and second terminals and is connected at said first terminal to said series circuit at a point between said detector diode and the directional coupler, and is connected at said second terminal thereof to said signal line.

8. A diode limiter as recited in claim 5, further comprising a plurality of sets of respectively connected said PIN diode and matching lines.

9. A diode limiter as recited in claim 5, wherein said resistor has a selectively variable resistance value, thereby for selectively varying the value of the voltage generated across said series circuit by said extracted part of the high power electrical pulse signal and correspondingly the turn-on of said PIN diode, relative to a given level of said high power electrical pulse signal applied to the diode limiter circuit.

* * * * *

UNITED STATES PATENT AND TRADEMARK OFFICE
CERTIFICATE OF CORRECTION

PATENT NO. : 5,128,636
DATED : July 7, 1992
INVENTOR(S) : Nagahisa FURUTANI et al It is certified that error appears in the above-indentified patent and that said Letters Patent is hereby corrected as shown below:

Column 1, line 57, change "(b)" to --6(b)--.

Column 2, line 37, change "appears" to --appear--.
line 42, after "pulse" delete ",".
line 64, change "(b)" to --6(b)--.

Column 3, line 17, change "signal" to --(signal)--.
line 43, after "amplifier" insert --,--.
line 67, delete "a".

Column 4, line 38, change "and (b)" to --to 6(b)--.

Col. 5, line 10, change "passage $I_2$ and $I_2$" to --passage $I_2$ and $I_2'$--;
line 20, after "$P_i$" insert --,--;
line 24, change "volta" to --voltage--.

Col. 6, line 15, change "22, as" to --22. As--;
line 16, change "embodiment. A" to --embodiment, a--.

Signed and Sealed this

Nineteenth Day of April, 1994

Attest:

BRUCE LEHMAN

Attesting Officer    Commissioner of Patents and Trademarks